United States Patent [19]

Russell

[11] Patent Number: 5,545,920

[45] Date of Patent: Aug. 13, 1996

[54] LEADFRAME-OVER-CHIP HAVING OFF-CHIP CONDUCTING LEADS FOR INCREASED BOND PAD CONNECTIVITY

[75] Inventor: Ernest J. Russell, Richmond, Tex.

[73] Assignee: Texas Instruments Incorporated, Dallas, Tex.

[21] Appl. No.: 304,988

[22] Filed: Sep. 13, 1994

[51] Int. Cl.$^6$ .......................... H01L 23/52; H01L 23/48; H01L 29/40

[52] U.S. Cl. .......................... 257/666; 257/691; 257/692; 257/784

[58] Field of Search .................................. 257/666, 667, 257/668, 691, 692, 735, 782, 784, 676

[56] References Cited

U.S. PATENT DOCUMENTS 5,250,840  10/1993  Oh et al. .................................. 257/666
5,287,000  2/1994  Takahashi et al. ...................... 257/676
5,428,247  6/1995  Sohn et al. .............................. 257/676

*Primary Examiner*—Sara W. Crane
*Assistant Examiner*—Carl Whitehead, Jr.
*Attorney, Agent, or Firm*—William W. Holloway; Rich Donaldson; Leo Heiting

[57] ABSTRACT

A hybrid leadframe-over-chip (LOC) semiconductor package is generally comprised of bonding finger elements located over a surface of a semiconductor component and electrically coupled, by means of conducting wires, to the bonding pads located on the surface. In addition, at least one bonding finger is located outside the boundary of the surface of the semiconductor component. Each bonding finger located outside the boundary is coupled, by a conducting wire, to a bonding pad positioned within the boundary of the semiconductor component. In this manner, for a given semiconductor component size and for given routing and lead dimension constraints, a larger number of conducting paths can be provided between the leadframe and the semiconductor component.

9 Claims, 6 Drawing Sheets

LEADFRAME-OVER-CHIP HAVING OFF-CHIP CONDUCTING LEADS FOR INCREASED BOND PAD CONNECTIVITY

BACKGROUND OF THE INVENTION

1. Field of the Invention

This invention relates to the packaging semiconductor components and, more particularly, to the packaging of semiconductor components which require a large number of electrical connections to external devices. The requirement of a large number of connections to a semiconductor component which is physically small can exceed the parameters imposed on the conducting leads of the leadframe.

2. Description of the Related Art

Many modern electronic systems incorporate various modular electronic components. For example, personal computers may comprise modular electronic components in the form of Dynamic Random Access Memory units. Each of the modular electronic components may comprise an integrated circuit fabricated on a semiconductor substrate. Each modular electronic component is coupled to the electronic system by a series of pins extending in a predetermined sequence from a body of the modular electronic component. The pins are coupled to leads of a lead frame. The lead frame is coupled to the integrated circuit during the fabrication of the modular electronic component.

A specific electronic signal may be associated with each pin of the modular electronic component. When the modular electronic component is properly coupled to the electronic system, the pins transmit these electronic signals between the integrated circuit and corresponding lines of the electronic system. Thereby, the electronic system may function properly. If, however, the sequence of pins of the modular electronic component does not match a sequence of corresponding lines of the electronic system, the electronic system will not receive the proper signals at the proper lines. Therefore, the electronic system would not function properly.

One typical method for connecting the lead frame to the integrated circuit is referred to in the industry as leadframe-over-chip (LOC) technology. As mentioned above, the integrated circuit is typically fabricated on a semiconductor substrate. The integrated circuit and substrate is commonly known as an "integrated circuit chip." The integrated circuit also comprises a row of bonding pads for connecting the integrated circuit to the leads of the lead frame. According to LOC technology, the lead frame is placed over the integrated circuit chip such that the row of bonding pads may be coupled to appropriate leads of the lead frame.

Typically, the leads of a lead frame are routed in only 2 dimensions. This spacial limitation means that leads may not cross over other leads. Consequently, the sequence of leads in a lead frame will be the same as the sequence of the bonding pads on the integrated circuit. Integrated circuits are manufactured by a number of different companies. Often, each of these companies produce competing integrated circuits that perform the same function. However, the various integrated circuits differ in the manner in which the integrated circuits are organized on the semiconductor substrate. For example, because integrated circuits are complicated and designed independently by these companies, the sequence of bonding pads may vary from manufacturer to manufacturer even though the integrated circuits perform the same function. Therefore, each modular component produced by a particular manufacturer may have a different "pin out." A "pin out" is the physical sequence in which pins associated with specific electronic signals extend from the modular electronic component.

Two modular components that perform the same function but have different pin outs will not both function properly when coupled to a specific electronic system. At least one of the modular components will not provide the appropriate electronic signals to the system. This is contrary to the interchangability that modular components should provide. A prior solution involves adding a few semiconductor processing operations to change the sequence of bonding pads of an existing integrated circuit design. In this manner, the bonding pads may be formed in the same sequence as the leads of the lead frame.

For several years, the number of the electronic components and the complexity of the electronic components associated with each integrated circuit has continually increased without a commensurate increase in the size of the integrated circuit itself. As a consequence of the increased number and complexity of the integrated circuit, an increasing number of electrical connections must be made to the integrated circuit. Because the routing of the electrical connection must typically be made in two dimensions, only limited selection of the position of bonding pads is available. In addition, the apparatus performing the bonding of the conducting wires to the leadframe and to the bonding pads on the integrated circuit has physical limitation with respect to the size of the leads on the lead frame, the traditional approach to coupling the bonding pads to the leadframe has become inadequate.

A need has therefore been felt for apparatus and a method for electrically coupling the greater number of bonding pads of a semiconductor integrated circuit component to a leadframe in the leadframe-over-chip technology while observing the physical limitations required for a satisfactory bonding process and the limitation imposed on the routing of leads in integrated circuits.

SUMMARY OF THE INVENTION

The aforementioned and other features are provided, according to the present invention, by a leadframe in a semiconductor package which, in addition to the bonding fingers positioned over the surface of the integrated or semiconductor component having the bonding pads (i.e., in the leadframe-over-chip configuration), some bonding fingers are positioned outside the boundary of the surface of the component. Conducting wires couple the off-chip bonding fingers with the semiconductor component bonding pads, crossing the semiconductor component surface boundary in the process. In order to minimize the length of the conducting wires, the off-chip bonding fingers can be coupled to the bonding pads near the end of the row of bonding pads on the semiconductor component. In the alternative, selected bonding pads can be removed from the row of bonding pads on the semiconductor component and positioned near the component surface boundary proximate to the bonding fingers to minimize the length of conducting wire coupling the bonding pads and the bonding fingers. In another configuration, the bonding fingers can be coupled to the semiconductor component by a combination of the end members of the row of bonding fingers and by bonding pads positioned close to the boundary of semiconductor component. In any of the disclosed configurations, the number of electrical connections to the semiconductor component can be increased as compared to the strict leadframe-over-chip configuration for the given routing and physical dimension restrictions imposed on the package.

These and other features of the present invention will be understood upon reading the following description along with the Figures.

DESCRIPTION OF THE PREFERRED EMBODIMENT(S)

1. Detailed Description of the Drawings

Figure 1A:
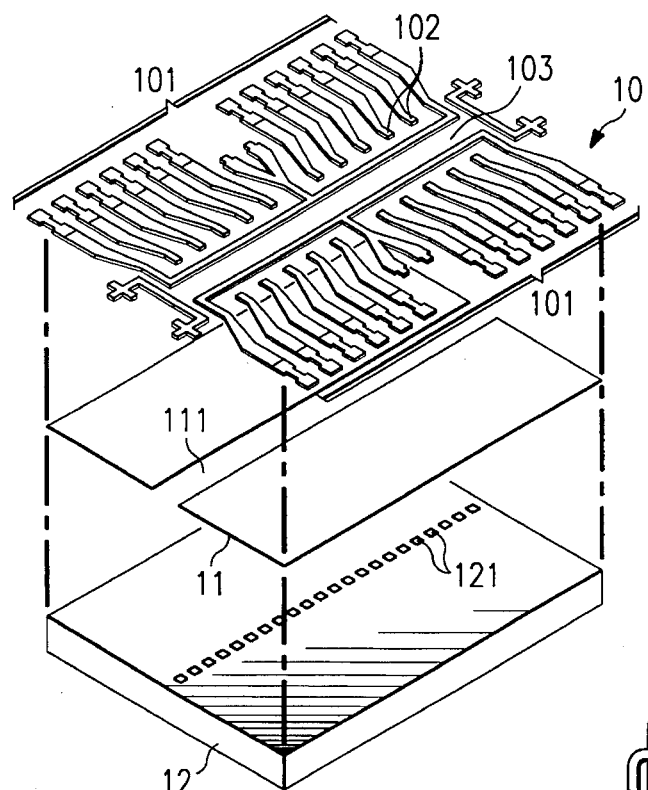
FIG. 1A is an assembly view of a conventional leadframe-over-chip package.
Figure 1C:
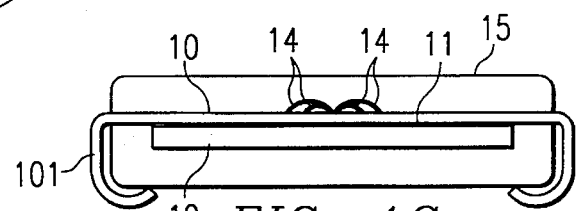
FIG. 1C is a cross-sectional view of a leadframe-over-chip package.
Figure 1B:
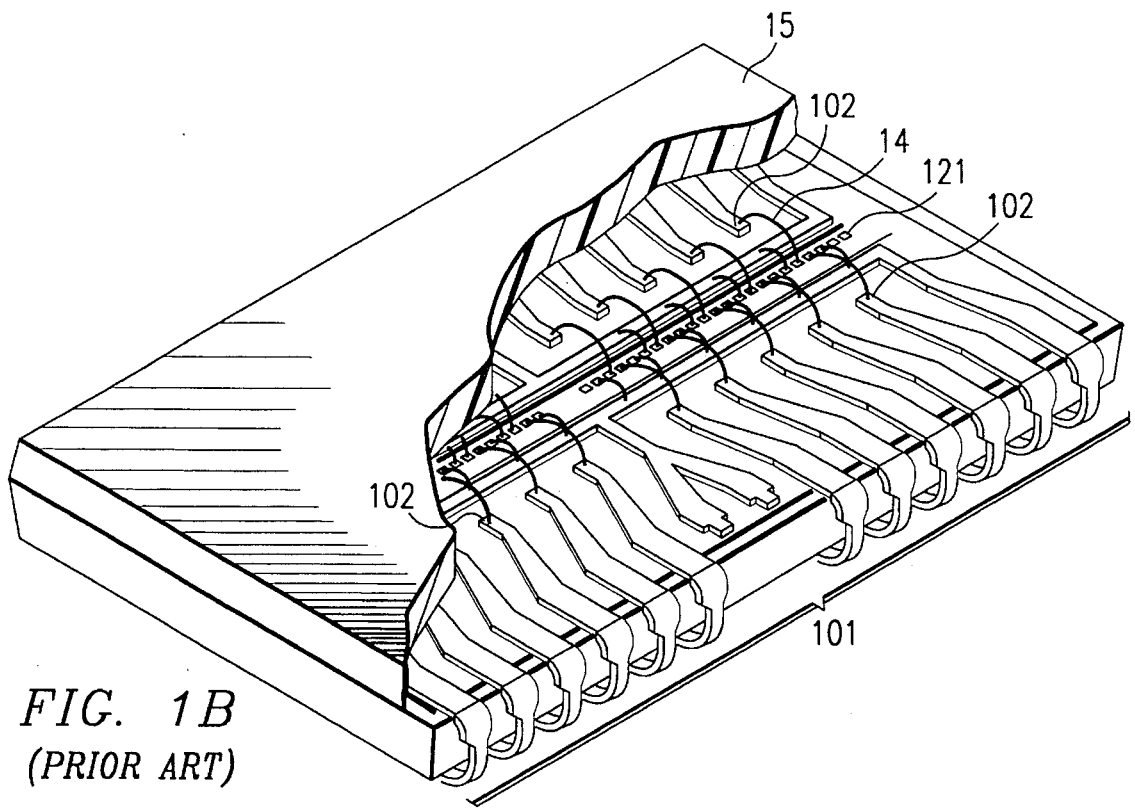
FIG. 1B is a cutaway, perspective, view of a leadframe-over-chip package.

Referring to FIG. 1A, 1B, and 1C, a typical relationship between the semiconductor chip or component and the leadframe in a leadframe-over-chip configuration is shown. In the assembly view of the leadframe-over-chip configuration in FIG. 1A, the leadframe 10 is positioned relative to a semiconductor component 12 so that an aperture 103 in the conducting leads 101 and bonding fingers 102 exposes the bonding pads 121 of the semiconductor component 12. The double-sided tape 11, which attaches the leadframe 10 to the component 12, is structured such that an exposed region 111 in the tape is coincident with the leadframe aperture 102 and the row of bonding pads 121. In FIG. 1B, the components of FIG. 1A are shown in the assembled form. In addition, conducting wires 14 have one end bonded to a preselected bonding pad and a second end bonded to an associated bonding finger 102, the bonding finger typically being part of the conducting lead 101. Finally, the semiconductor component 12, the leadframe 10, the two-sided tape 11, and the conducting wires 14 are embedded in an encapsulating material 15 as illustrated in FIG. 1C. The encapsulating material 15 provides a supporting structure for the components, especially the conducting wires which, because of their fragile structure, would be subject to the mechanical failure or movement. The conducting leads 101, which extend beyond the encapsulating material 15, are typically bent as shown in FIG. 1B and FIG. 1C. The package can then be inserted in an appropriate socket, the bent lead fingers 101 serving as either pressure electrical contacts or for surface mount attachment.

Figure 2:
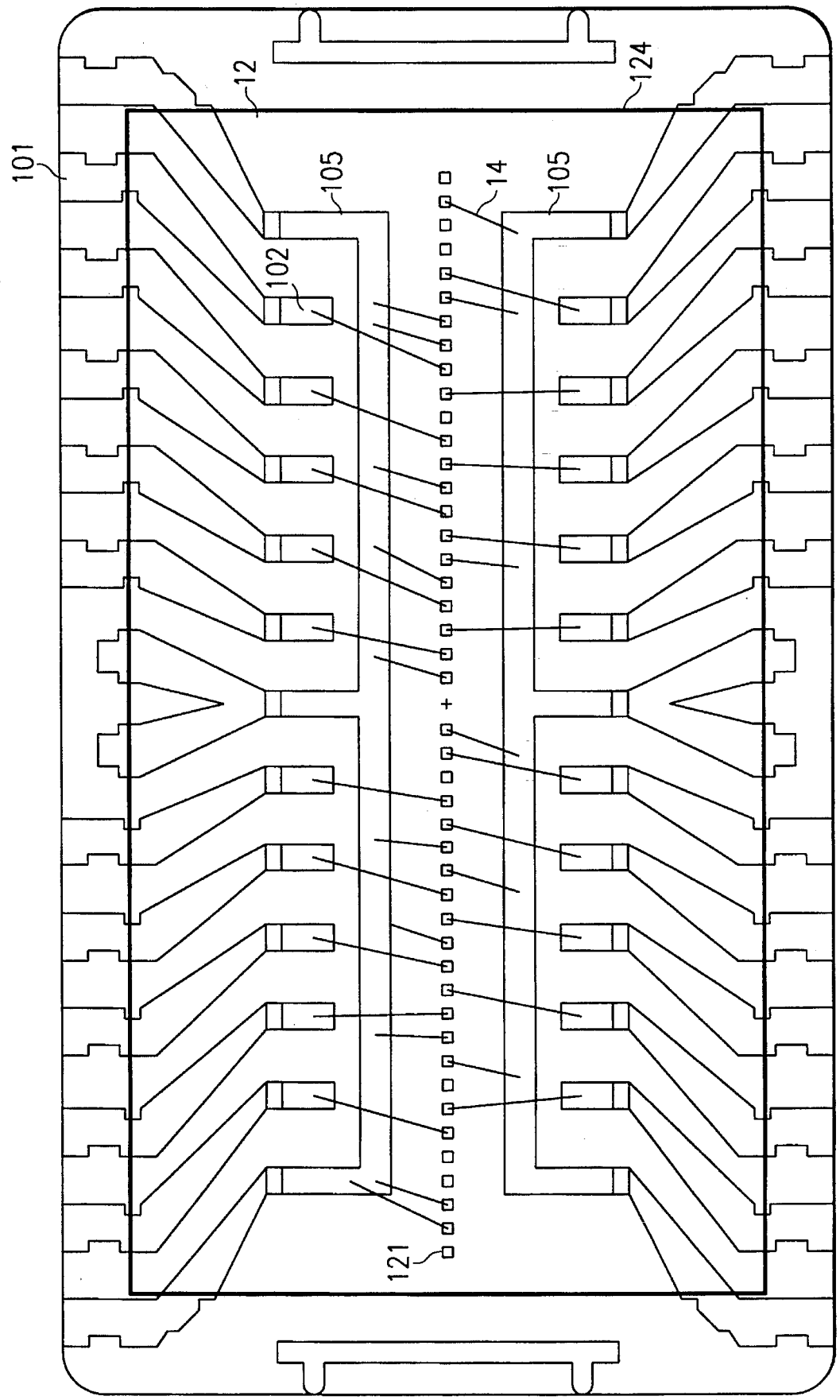
FIG. 2 is a top view of a prior art leadframe and a semiconductor component structured in a leadframe-over-chip configuration.

Referring to FIG. 2, a top view of a typical leadframe-over-chip configuration is shown. The boundary 124 of component 12, as viewed from the top, is emphasized to emphasize the leadframe-over-chip configuration. Conducting wires 14 electrically couple selected bonding pads 121 of the semiconductor component with a bonding pad in the row of bonding pads 121. Note that in the typical configuration shown, the bonding pads 121, the conducting wires 14, and the portion of the leads (i.e., bonding fingers 102) to which the conducting wires 14 are coupled are positioned over the semiconductor chip. Also illustrated are the certain conducting leads 105 which are typically coupled to a plurality of bonding pads. These special leads 105 distribute power to the elements incorporated in semiconducting component 12 and the leads are frequently routed proximate to and parallel to the row of bonding pads 121.

Figure 3:
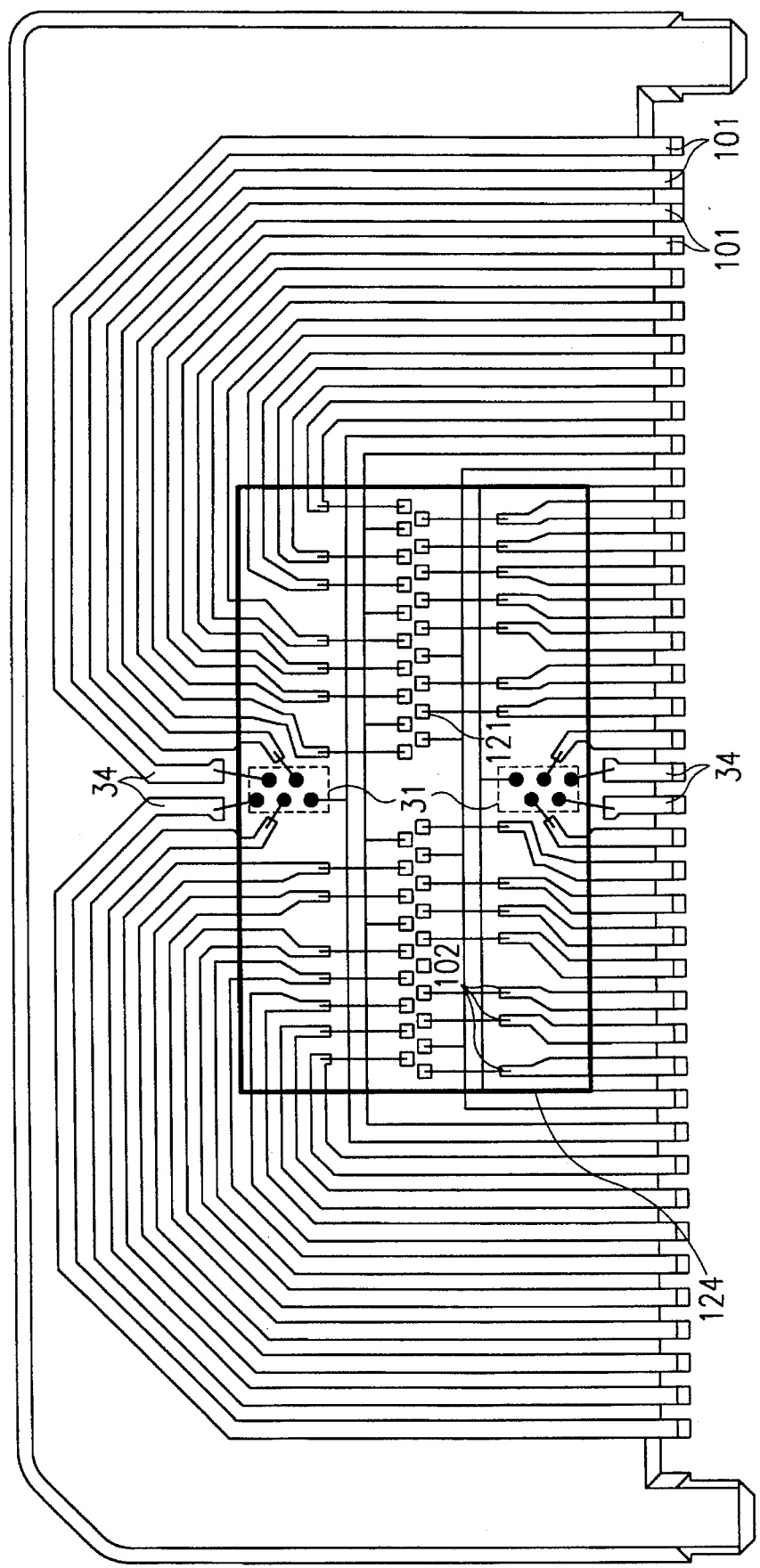
FIG. 3 is a top view of one embodiment of the hybrid leadframe-over-chip configuration according to the present invention.

Referring to FIG. 3, a top view of an embodiment of a hybrid leadframe-over-chip configuration according to the present invention is shown. In general, a majority of the bonding fingers 102 are physically located within the boundary of the surface of the semiconductor component surface having the bonding pads located thereon. However, selected ones of the bonding fingers (34) are positioned in a region outside of the boundary 124 of the semiconductor component 12. The off-chip bonding fingers can generally be divided into two categories. In the first category illustrated in FIG. 3, the bonding pads 31 are not located in the row(s) 121 of bonding pads, but are positioned sufficiently close to the boundary 124 of the component 12 so that conducting wires 14 can be bonded between the bonding pads 31 and the bonding fingers 34 positioned proximate to the bonding pads 31, the bonding fingers being outside of the boundary 124 of the semiconductor component 12. In this manner, the additional area available outside of boundary 124 can be used for the leads and bonding fingers while preserving parameters such as width of bonding pads 121 and/or bonding fingers 102 or 34 and the distances therebetween.

Figure 4:
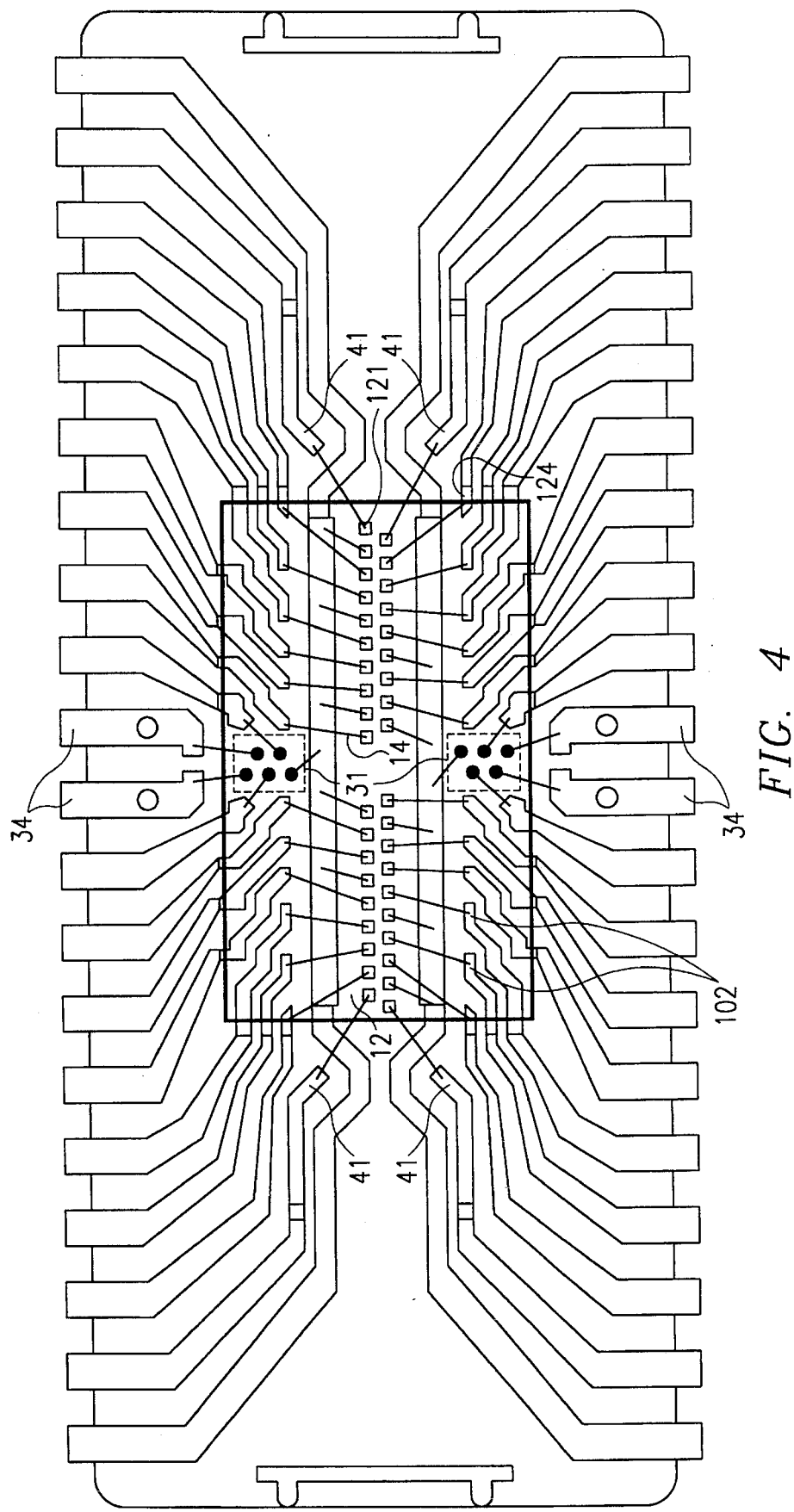
FIG. 4 is a top view of a second embodiment of the hybrid leadframe-over-chip configuration according to the present invention.

Referring to FIG. 4, a second category of off-chip bonding finger is shown. The row(s) of bonding pads 121 of the semiconductor component 12 have bonding pads sufficiently near to the edge of boundary of the semiconductor component 12 so that the conducting wires 14 from those bonding pads 121 can be bonded to bonding fingers 41 which do not extend over the boundary 124. FIG. 4 also shows examples of the off-chip bonding configuration described in FIG. 3.

Figure 5:
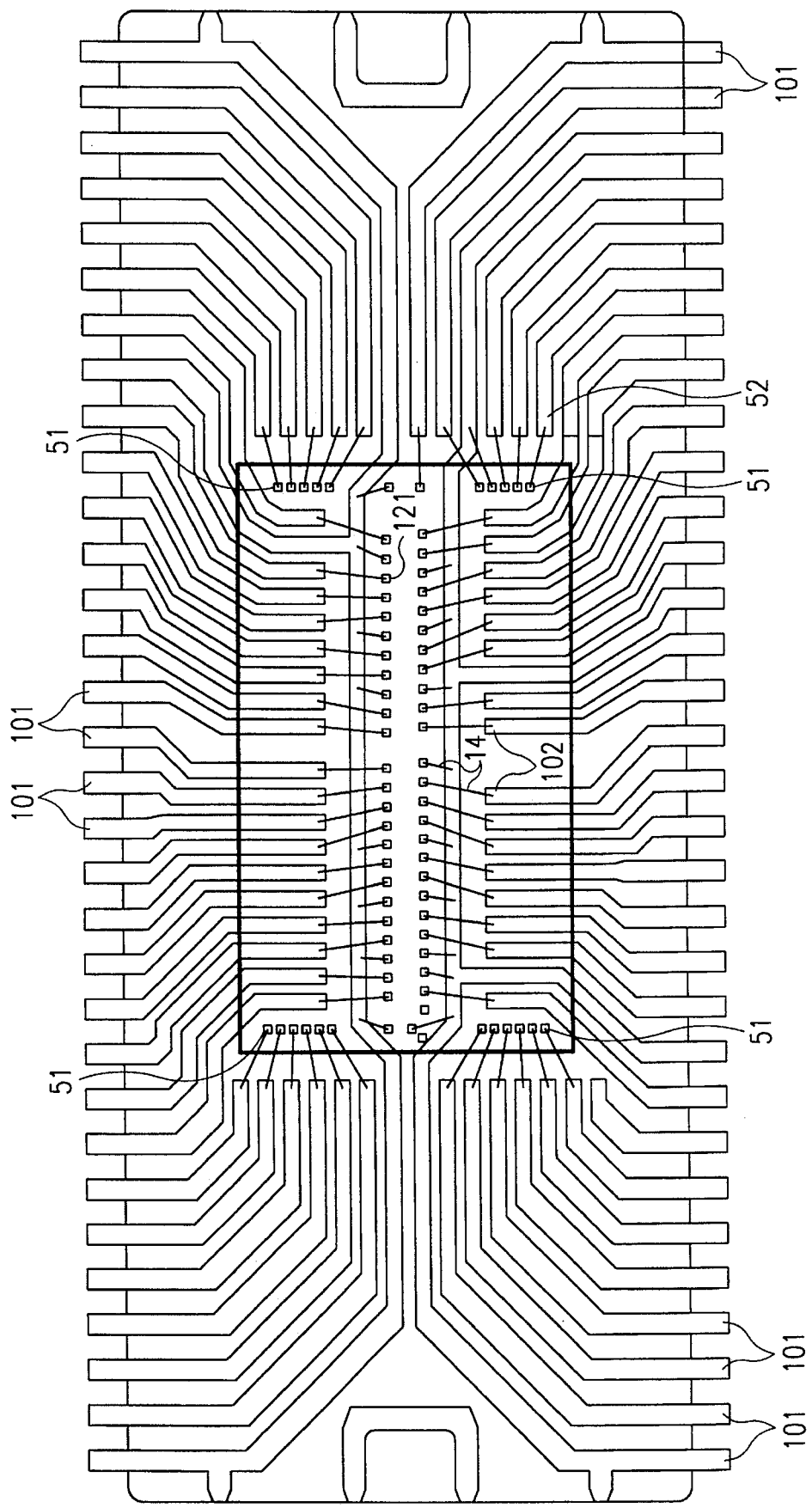
FIG. 5 is a top view of a third embodiment of the hybrid leadframe-over-chip configuration according to the present invention.

Referring to FIG. 5, a third category of hybrid on- and off-chip bonding fingers is shown. In this configuration, the row(s) of bonding pads extend along the length of the bonding pad surface of the semiconductor component. Other groups of bonding pads 15 are positioned in rows along the width boundary of the semiconductor component 12. As will be seen from FIG. 5, this configuration permits an especially high density of bonding fingers 102 off-chip, the bonding fingers still being in the vicinity of the additional rows of bonding pads.

Figure 6:
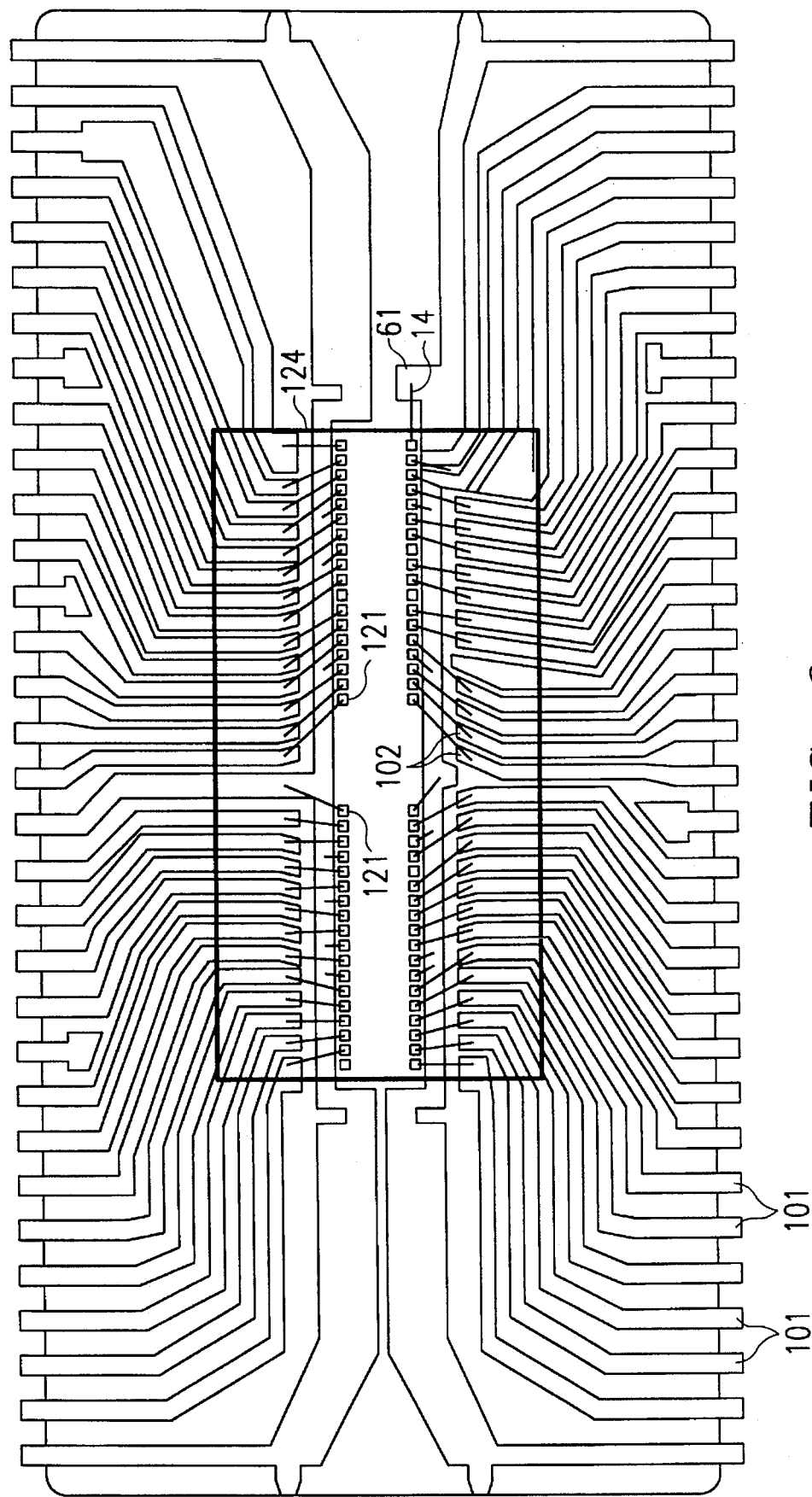
FIG. 6 is a top view of a hybrid leadframe-over-chip configuration in current production.

Referring to FIG. 6, an example of the present invention currently included in a product is shown. In this configuration, one off-chip bonding finger 61 is used. This bonding finger 61 is coupled to an end member of the row(s) of bonding pads 121.

2. Operation of the Preferred Embodiment(s)

As the number and complexity of the elements incorporated in semiconductor components has increased, the number of electrical connections needed to include a semiconductor component in an electrical circuit has also increased. Because of continuing improvements in the miniaturization techniques, the size of the semiconductor component itself has not increased and in some instances may even have decreased. Coupled with routing constraints and physical parameter limitations, the leadframe-over-chip technology which has been used to couple electrically the semiconductor component to an external circuit has become increasingly difficult to implement. The present invention provides a technique for overcoming the limitations of the leadframe-over-chip technology. In particular, the constraint is removed in the present invention whereby every bonding finger, i.e., the portion of the conducting lead to which the conducting wire is bonded, is bonded entirely within the semiconductor component boundary. This removal results in a hybrid leadframe structure in which at least one of the bonding fingers is not positioned to be bonded within the projected boundary of the semiconductor component upon which the bonding pads are located. The bonding pads to which the off-chip bonding fingers are coupled can be the extremities of the row (or rows) of bonding pads typically found in a semiconductor component. The semiconductor chip can also be fabricated in a manner such that bonding pads are positioned close to at least one boundary of the component. The repositioning of the bonding pads to the vicinity of the boundary can have some impact on the component fabrication process.

While the invention has been described with particular reference to the preferred embodiment, it will be understood by those skilled in the art that various changes may be made and equivalents substituted for elements of the preferred embodiment without departing from the invention. For example, the present invention has been described with particular reference to a dynamic random access memory unit. However, the technique for increasing the electrical interconnection between the bonding pads and the bonding fingers can be applied to any semiconductor package having a semiconducting unit with a higher number of bonding pads for exchanging electrical signals. In addition, many modifications may be made to adapt a particular situation and material to a teaching of the invention without departing from the essential teachings of the present invention.

As is evident from the foregoing discussion, certain aspects of the invention are not limited to the particular details of examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A semiconductor package comprising:
   a semiconductor component, said semiconductor component having first plurality of bonding pads positioned on one rectangular surface of said semiconductor component and generally disposed in two rows along a center of and parallel to an edge of said rectangular surface, said bonding pads being electrically coupled to electrical elements of said semiconductor component;
   a plurality of conducting wires, each conducting wire having a first end electrically coupled to a preselected bonding pad; and
   a leadframe-over-chip, said leadframe-over-chip having a plurality of first conducting leads extending over said semiconductor component surface, each first conducting lead having a first bonding region to which a second end of a conducting wire coupled to a bonding pad is coupled, said leadframe-over-chip having at least one second conducting lead with second bonding region not extending over said semiconductor component surface and coplanar with said first conducting leads, said second bonding region coupled to a bonding pad by a conducting wire.

2. The semiconductor package of claim 1 wherein said second bonding region is positioned proximate to an end of said bond pad rows and coupled to a row bond pad.

3. The semiconductor package of claim 1 wherein at least one second bonding pad is positioned apart from said rows and proximate to a boundary of said semiconductor component, a second bonding region being coupled to said second bonding pad by a conducting wire.

4. A semiconductor package comprising:
   a semiconductor component having plurality of bonding pads arranged in two rows in a center of a rectangular surface thereof and parallel to an edge of said rectangular surface;
   a leadframe-over-chip having generally planar geometry positioned proximate to said rectangular surface, said leadframe-over-chip including first conducting leads with first bonding regions formed thereon, said first bonding regions positioned over said rectangular surface, said leadframe-over-chip including at least one second conducting lead with a second bonding region not extending over said first surface and coplanar with said first conducting leads; and
   conducting wires having a first end electrically coupled to selected bonding pads and a second end electrically coupled to a predefined bonding region.

5. The semiconductor package of claim 4 wherein said second bonding region is positioned proximate to an end of said bonding pad rows, said second bonding region being coupled to a row bonding pad by a conducting lead.

6. The semiconductor package of claim 4 further including at least one second bonding pad positioned on said semiconductor component proximate said surface edge of said semiconductor component, said second bonding region coupled to said second bonding pad.

7. An improved leadframe-over-chip for use with a semiconductor component, wherein bonding pads on a rectangular surface of said semiconductor component are to be coupled to bonding fingers of conducting leads of said leadframe-over-chip by conducting wires, said bonding pads arranged in two rows parallel to a rectangular surface edge and in a center of said rectangular surface, said leadframe-over-chip having
   a plurality of first conducting leads with first bonding regions coupled thereto, said conducting leads and said first bonding regions extending over said rectangular surface of said semiconductor component to a position proximate said bonding pads; wherein the improvement comprises:
   at least one second conducting lead with second bonding region coplanar with said first conducting leads and coupled first bonding regions and proximate to a bonding pad to which said coupled bonding region is to be electrically coupled, said second conducting lead and said coupled bonding region not extending over said rectangular surface.

8. The leadframe-over-chip of claim 7 wherein said second bonding regions are proximate to end members of a row of bonding pads and coupled to a row bonding pad by a conducting wire.

9. The leadframe-over-chip of claim 7 wherein said semiconductor component includes a group of second bond pads proximate said surface edge and removed from said rows of bonding pads, said second bonding regions proximate to said group of second bond pads.

* * * * *